United States Patent [19]

Purdy

[11] Patent Number: 5,902,396
[45] Date of Patent: May 11, 1999

[54] AMMONOTHERMAL GROWTH OF CHALCOGENIDE SINGLE CRYSTAL MATERIALS

[75] Inventor: Andrew P. Purdy, Alexandria, Va.

[73] Assignee: The United States of America as represented by the Secretary of the Navy, Washington, D.C.

[21] Appl. No.: 08/965,023

[22] Filed: Nov. 5, 1997

[51] Int. Cl.$^6$ .......................................................... C30B 7/10
[52] U.S. Cl. .................................................. 117/71; 117/72
[58] Field of Search ........................................ 117/71, 72

[56] References Cited

U.S. PATENT DOCUMENTS 5,322,591   6/1994   Harris et al. ............................... 117/71

OTHER PUBLICATIONS

"Application of hydro (solvent) thermal technique to the synthesis of metal carbonyl chalcogenide clusters."; Huang, et al; Inorganic Chemistry (1993), 32(6), pp. 821–825.

*Primary Examiner*—Felisa Garrett
*Attorney, Agent, or Firm*—Thomas E. McDonnell; George A. Kap

[57] ABSTRACT

Single crystals of binary and ternary compounds of alkaline earth and a chalcogen, with or without a transition element, are grown by: charging a reaction vessel with an alkaline earth chalcogenide, with or without a transition element or a halide thereof, an acidic mineralizer, and anhydrous ammonia to where the fill factor in the reaction vessel is 30–95%; sealing the reaction vessel to the outside atmosphere; heating the contents of the reaction vessel to a temperature of at least 300° C. until single crystal materials visible to the eye form in the reaction vessel; cooling the contents of the reaction vessel; and extracting the single crystal materials from the reaction vessel.

19 Claims, 1 Drawing Sheet

AMMONOTHERMAL GROWTH OF CHALCOGENIDE SINGLE CRYSTAL MATERIALS

BACKGROUND OF INVENTION

1. Field of Invention

This invention pertains to a process for growing single crystal chalcogenide materials or compounds of one or more divalent metals, with or without a transition element. The divalent metals are selected from alkaline earths, Group 12 elements, and europium.

2. Description of Prior Art

Single crystals of CaS, with no added impurity, have been grown by vapor phase transport using iodine. Typically, the charge of powdered CaS was located at one end of a silica ampoule of about 200 mm in length and 28 mm bore. After gently heating in vacuum with about 1 $\mu g/mm^3$ of iodine added to the charge, the ampoule was sealed under vacuum and then placed in a furnace with the CaS charge at about 1130° C. and the growth end of the ampoule at about 830° C.

Single crystals of alkaline earth chalcogenides have been prepared by the floating zone method using a Xe-arc image furnace. The starting sulfide powder materials were prepared by heating the respective carbonates at 1100° C. in a gas stream mixture of $H_2S/H_2$. The products were pulverized to fine powders and the procedure was repeated to obtain final materials. The powders were then stuffed into a thin rubber tube forming a rigid rod 3–6 mm wide and 100–150 mm long. The tube was then immersed in an oil cylinder of an oil press and was compressed under a hydrostatic pressure of about 1000 $kg/mm^3$. After peeling off the rubber tube, a rod of compressed powder was obtained which was sufficiently stiff without any binder or subsequent sintering.

Using the Kitazawa et al. Xe-arc image furnace, a first piece of the pressed rod was mounted at bottom therein to serve as a seed for single crystal formation and a second piece of the pressed rod was mounted at top of the apparatus spaced from but coaxial with the first piece. Discharge of the Xe lamp was focussed at the top of the seed rod, thus forming a hot spot. The second piece was slowly lowered towards the first while the discharge current of the lamp was increased until the tip of the second rod was melted to form a melted drop of the second piece of the rod. At this point, lowering of the second piece was stopped and the first piece was raised towards the hot spot to form a floating melt zone when the melted drop of the second piece was fused with the first piece in the hot spot. Then the lower part of the floating melt zone was slowly pulled down out of the hot spot and was solidified into crystalline form. By sweeping the melt zone across the second rod piece on the feed rod, growth of the single crystal took place along the <100> direction. Seed crystals from this process can be used to grow single crystals of larger size.

Polycrystalline samples of the series $Ca_{1-x}Y_{2x/3}S$, with x=0.2–0.7, were prepared by reacting mixtures of stoichiometric quantities of the binary sulfides at 1025° C. for 10 days and then slowly cooling to encourage cation/vacancy ordering. Reactions were carried out in carbon crucibles enclosed in evacuated silica ampoules that had been previously outgassed under vacuum at 900° C. Single crystals were grown from eutectic $CaCl_2$:KCl flux and 1:1 molar mixture of the binary sulfides. The reaction mixture consisting of charge and flux at respective weight ratio of 1:6.5 was heated at 1025° C. for 3 weeks and then slowly cooled to room temperature.

Crystals of $CaY_2S_4$, $SrY_2S_4$ and $BaY_2S_4$ were grown from eutectic halide fluxes having melting points in the range of about 620–645° C. Synthesis was carried out in carbon crucibles enclosed in silica ampoules evacuated to less than $10^{-4}$ Torr that were previously outgassed under vacuum at about 900° C. Exposure of the reaction mixtures to moisture was minimized and the fluxes were stored in a vacuum oven at 140° C. For crystal growth of $CaY_2S_4$ and $SrY_2S_4$ crystals, the charges were 1:1 molar mixtures of the respective binary sulfides whereas for $BaY_2S_4$ crystals, the polycrystalline form of the compound was used, the compound being prepared by reacting a stoichiometric mixture of the binary sulfides at 1000° C. for 1 month. The crystals were obtained by heating about 1:10 charge:flux mixture over a period exceeding 10 hours to above 1000° C., soaking for up to 20 days and then slowly cooling. The crystals were separated from the flux by soaking in distilled water.

OBJECTS AND SUMMARY OF INVENTION

It is an object of this invention to grow single crystal materials at lower temperatures.

Another object of this invention is to grow single crystal materials of a divalent metal chalcogenide for applications such as window and phosphor materials.

It is another object of this invention to form doped single crystal materials.

It is another object of this invention to grow binary and ternary single crystal materials with or without at least one transition element that is transparent to both the 3–5 and 8–14 micron infrared bands.

These and other objects of this invention are accomplished by reacting a divalent metal chalcogenide with an acidic mineralizer in presence of liquid ammonia solvent at high pressures and at temperatures in the range of about 300 to 550° C. until single crystal materials are produced. The divalent metals contemplated herein include elements of alkaline earths, Group 12 elements of the Periodic Table and europium.

DESCRIPTION OF PREFERRED EMBODIMENTS

Figure 1:
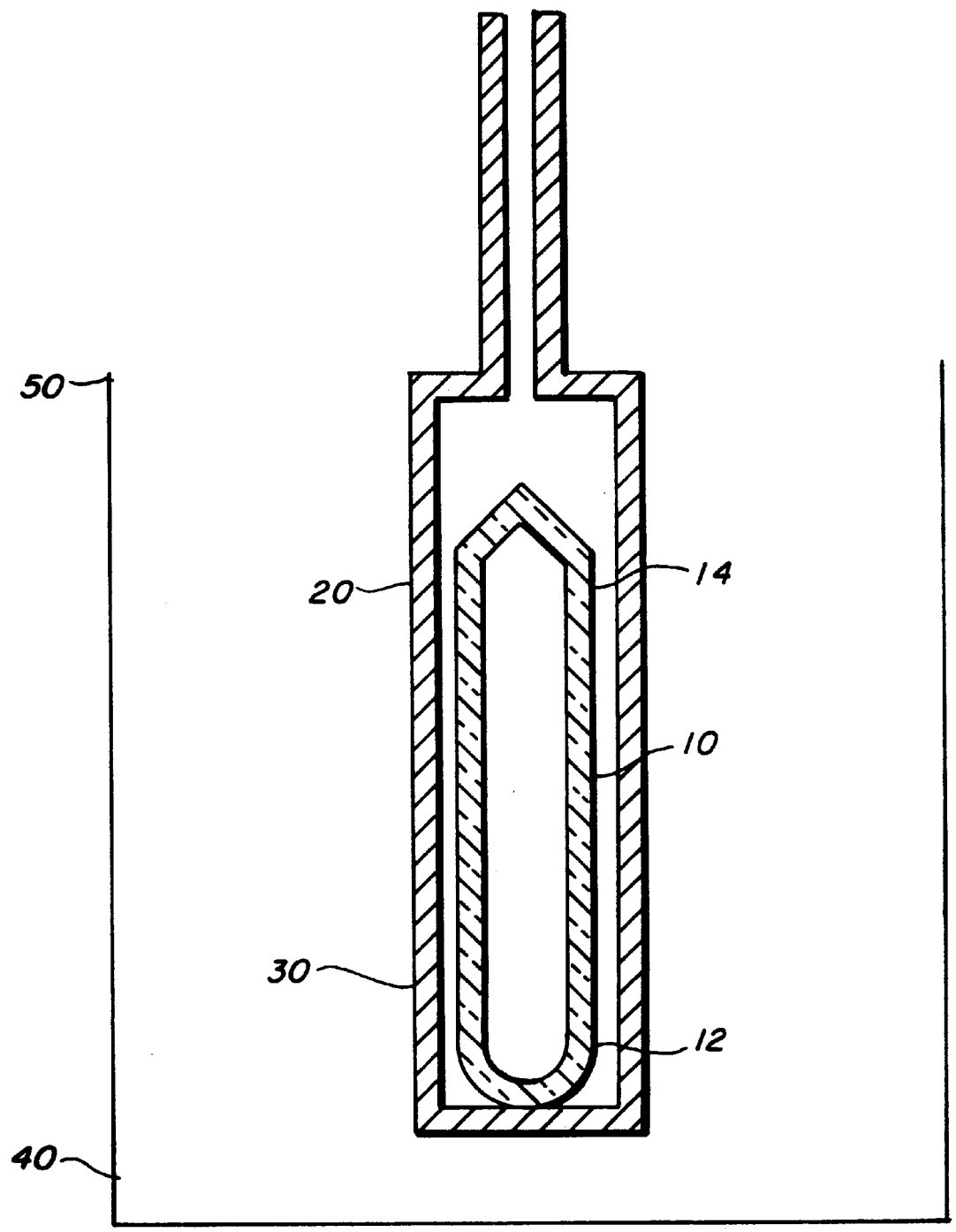
FIG. 1 is a schematic illustration of a commercially available LECO HR-1B hydrothermal system containing a sealed quartz ampoule counter pressured with water.

This invention partains to a process for growing single crystal materials at a high pressure and a low temperature. Single crystal materials include pure binary chalcogenides as well as solid solutions or those binaries with another chalcogenide, and ternary chalcogenides with an alkaline earth, a Group 12 element, europium and a transition element. The process of this invention is characterized by the steps of introducing the chalcogenide, with or without a transition element, into a reaction vessel along with an acid mineralizer and ammonia solvent, sealing the reaction vessel from the outside atmosphere, heating the reaction vessel to a temperature above 300° C. until single crystal materials are formed, cooling the reaction vessel and removing the cooled single crystal material from the reaction vessel.

More specifically, the process of this invention includes the steps of introducing a divalent metal chalcogenide powder or compounds thereof, ammonia solvent and an acid mineralizer into a reaction vessel so that the fill factor is in the range of 30–95 volume %, based on the combined volume of the divalent metal chalcogenide powder, the solvent, and the acid mineralizer; evacuating the reaction vessel to remove gases; sealing the reaction vessel from outside atmosphere; heating contents of the reaction vessel to a temperature above 300° C. but below about 550° C. until single crystal material forms; cooling the crystal material disposed in the reaction vessel; and removing the crystal material from the reaction vessel.

The chalcogenide reactant is typically a fine powder and is composed of an alkaline earth element selected from beryllium, magnesium, calcium, strontium, barium and radium, particularly calcium and strontium, and a chalcogenide selected from oxygen, sulfur, selenium and tellurium, particularly sulfur. The binary chalcogenide is a stoichiometric compound that is prepared by reacting stoichiometric quantities of an alkaline earth and a chalcogen. Binary single crystal materials, doped or undoped, are stoichiometric compounds. As an alternative to using premade chalcogenides as starting materials, the pure alkaline earth metal and the chalcogen may be used directly, as they will react to form the chalcogenide when the reaction vessel is heated.

The chalcogenide single crystal material can be doped by adding any desired metal ion into the reaction vessel. Amount of the dopant can vary from ppm quantity up to several percent, such as from about 1 ppm to below 5%, based on the moles of the alkaline earth chalcogenide. For instance, CaS single crystals can be grown containg 0.9 mol % manganese by the addition of a small amount of 1 mole % of $MnI_2$, on metal basis, to the initial charge. Also, doped CaS single crystals can be grown containing 0.2 mol % copper by the addition of 1 mol % CuI to the initial charge. Black square crystal plates of $NH_4CU_4S_3$ also formed near the bottom of the reaction vessel in the case of the latter copper doped CaS single crystals. Doping of the alkaline earth chalcogenide made pursuant to the process disclosed herein can also be accomplished by other conventional means.

The ternary single crystal materials are grown when larger amounts than doping amounts, such as 20–115 mol %, based on the amount of the divalent chalcogenide, of an element or a compound thereof is used. Some ternaries are water sensitive and some are not. The ternary crystal materials typically contain a divalent element selected from alkaline earths, Group 12 elements, or europium, a chalcogide, and a transition element. A transition element is one of a group of metallic elements from Groups 4 to 11 (IVB to IIB) of the Periodic Table. Transition elements of the Periodic Table include elements through 29, or through copper; elements through 47, or through silver; and elements through 79, or through gold. The ternary single crystal materials of this invention has a wide, unpredictable stoichiometry. Amounts of materials and conditions of the process can be empirically determined by routine experimentation.

Acidic mineralizer is any substance that is soluble in ammonia and which produces a hydrogen ion ($H^+$). It functions to react with the chalcogenide of the alkaline earth chalcogenide to make it soluble in the ammonia solvent and acts as a transport in the formation of the crystal material. It is typically in a solid, powder form but it can be in any form, such as a liquid.

Acidic mineralizers suitable herein typically include any ammonium salt ($NH_4X$) soluble in liquid ammonia, where X is a halogen or any negative ion the ammonium salt of which does not engage in any deleterious side reaction. Most ammonium salts are easily solubilized in ammonia solvent since they form hydrogen bonds with the solvent. Suitable acid mineralizes in this group include ammonium iodide, ammonium bromide and ammonium chloride. Acidic mineralizers suitable herein also include alkylammonium halides having the formula $R_xNH_{4-x}{}^xY^-$, where Y is halide and x is 1–3. A suitable acid mineralizer in this group is dimethylammonium chloride with x being 2. Also suitable herein are acid mineralizers having the formula $R_3PH^+X$, where X is a halide. A suitable acid mineralizer in this group is triphenylphosphonium chloride.

Amount of the acid mineralizer is typically from a trace amount to 0.5, such as 0.001–0.5, and more typically 0.05–0.3 mole per mole of the alkaline earth chalcogenide. If less than 0.001 mole per mole of an acidic mineralizer is used, the acid mineralizer is ineffective; if more than 0.5 mole per mole of an acidic mineralizer is used, it may consume the alkaline earth chalcogenide. Since some acidic mineralizers are more effective than others, less of the more effective acidic mineralizer need be used. A small amount of mineralizer can mean a long reaction time before single crystal materials are obtained. However, low mineralizer concentrations produce less contamination of the products and thus improved quality. Growth rates of the crystal materials can be increased by using higher consentration of the chalcogenides and acidic mineralizers. It should be remembered, however, that better quality crystal materials are produced at slower growth rates.

The solvent that is used herein is anhydrous ammonia which is introduced into the reaction vessel under conditions so that it is a liquid. Sufficient ammonia is used to obtain a fill factor in the reaction vessel typically 30–95%, more typically 55–85%, based on volume of the ammonia solvent, alkaline earth chalcogenide and acidic mineralizer in the reaction vessel. Fill factors below about 30% do not produce single crystal materials because there is excessive amount of ammonia in the reaction vessel to act as a solvent. Where fill factor exceeds about 95%, there appears to be insufficient pressure in the reaction vessel for formation of single crystal materials. The fill factor establishes the pressure in the reaction vessel after it is sealed and heated. The dielectric constant, and therefore, the solvent properties of supercritical ammonia are highly dependent on pressure. The crystal materials will not be formed if an appropriate fill factor is not used. Water as a solvent does not work because it reacts with the chalcogenide to yield a hydroxide.

After filling the reaction vessel with an alkaline earth chalcogenide, acidic mineralizer and ammonia solvent to an appropriate level, the reaction vessel can be evacuated to remove any gas therein, which will depend, inter alia, on how the ammonia solvent is added to the reaction vessel. If liquid ammonia is used, the evacuation step is optional and can be omitted.

The reaction vessel is typically a quartz glass tube which is sealed by application of a torch flame at the end opposite from where the contents of the tube reside. If the reaction vessel is not made of glass, valve closure or something similar can be used to seal the vessel contents from the atmosphere.

After sealing the vessel contents, the reaction vessel, with the contents therein, is heated to a temperature above 300° C., preferably 350–500° C. A quartz reaction vessel is typically used since sulfide ions and acids attack steel at high temperature and pressure. Since the reaction vessel is closed-off, heating creates high pressure therein, on the order of 30,000 psi which can burst the pressure vessel if precaution is not taken to provide counter pressure on the outside of the reaction vessel.

Heating the contents of the reaction vessel to below 300° C. appears to result not in single crystal chalcogenides but in hydrosulfides instead, and temperatures much in excess of 500° C. lead to a reaction between water and the quartz ampoule. If another liquid other than water that does not attack quartz is used to provide the counter pressure, the upper reaction temperature can be raised well above 500° C.

Explosion of the reaction vessel can overcome by using a glass ampoule, placing the ampoule in a pressure vessel and introducing water, or some other pressurizing fluid, into the pressure vessel around the ampoule. Water is then pressurized to provide counter pressure around the ampoule while the contents in the ampoule and water around the ampoule are heated when the pressure vessel is placed in a furnace. Typically, the counter pressure is sufficient to prevent explosion of the ampoule if it equals or is at least slightly greater than pressure inside the ampoule. The initial counter pressure at room temperature is provided by pressurizing water to a pressure on the order of 10,000 psi. The counter pressure around the reaction vessel rises as water around the ampoule and the ampoule contents are heated. Counter pressure that is too high can result in implosion of the reaction vessel. The initial counterpressure is highly dependent on the size of the ampoule and the volume of the autoclave it is heated in.

On the basis of a constant charge, fill factor and duration, deposition of CaS single crystals starts at about 335° C. and the deposited mass generally increases with increasing temperature.

Duration of the heating step should be long enough to produce single crystal materials. This duration should be less than one month, typically up to a week or 1–50 hours, and more typically 2–24 hours, during which time binary single crystal materials deposit at the top of the reaction vessel and the ternaries form either at the top, bottom or in between in the reaction vessel. What takes place in the reaction vessel during heating is a solvothermal reaction that is conducted at above the boiling temperature of the solvent.

The reaction vessel must have a temperature difference between its upper portion and its lower portion in order to grow at least some of the single crystal materials pursuant to the process disclosed herein. The temperature difference between top and bottom of the reaction vessel, for a vertically disposed reaction vessel, was estimated in the furnace to be 50–100° C., but it can be substantially lower or higher. The temperature difference should be sufficient to form single crystal materials in the reaction vessel and should be at least about 1° C., preferably at least 20° C. Using the pressure apparatus of FIG. 1 or a similar apparatus, lower temperature should be at the upper portion of the reaction vessel whereas higher temperature should be at its lower portion. For a horizontally disposed reaction vessel, or a reaction vessel disposed at some intermediate position, the temperature difference is from one end to the opposite end of the reaction vessel. In terms of temperature gradient, it should be at least a fraction of Centigrade degree per centimeter to 20 Centigrade degrees per centimeter, more typically 1–10° C./cm of the reaction vessel length.

The heating step is followed by cooling to about room temperature over a period of many hours, typically 1–10 hours. Once sufficiently cooled, the reaction vessel is opened and the crystal materials are extracted. If an ampoule is used as the reaction vessel disposed within a pressure vessel where counter pressure is provided by initially pressurized and subsequently heated water which becomes supercritical, the ampoule is removed from the pressure vessel following cooling, opened by breaking and the crystal materials are extracted and washed, if needed.

Alternatives to using a quartz ampoule include such methods as a reactor fabricated from corrosion resistant alloys and directly pressurized with ammonia, or a metal reactor lined with a corrosion resistant material such as quartz or other ceramics. Other alternatives can also be used.

Single crystal materials obtained with the process disclosed herein are large single crystals which are at least visible to the eye. Single crystals on the order of mm in size can be produced by the process described and claimed herein. Seed crystals can be used at the start to increase size of the resulting crystals. Using larger sized reactors, such as would be used industrially, can result in very large crystals. Pattern of spots obtained by x-ray diffraction can be used to distinguish single crystal materials from polycrystalline materials. Single crystals of solid solutions, i. e., solid alloys of two or more compounds with the same crystal structure, can be grown. A specific example of this is CaS, a binary sulfide, and $Ca_xMg_{1-x}S$, a solid solution, but both have the same crystal structure.

Referring to specific embodiments of the process disclosed herein, at temperatures above 300° C. and with $NH_4I$ acid mineralizer, large CaS and SrS single crystals of several mm in size can be obtained at top of quartz tube reaction vessel. With SrS powder reactant, larger crystals can be produced more easily.

Using calcium oxide at 450° C. in place of a calcium sulfide, yielded single crystal hexagonal plates of $Ca(OH)_2$ at the top of the tube. The failure to obtain single crystals of CaO can be explained by the high thermal stability of $Ca(OH)_2$ which is reported to decompose to the oxide at 580° C. However, it is conceivable that crystals of CaO and other divalent metal oxides can be grown if an apparatus capable of temperatures in excess of 500° C. is used. For instance, nitrogen, argon, or carbon dioxide used to counterpressure the ampoule would allow higher temperatures to be obtained. Also, some corrosion resistant titanium alloys can be used instead of fused quartz as the pressure vessel. An ammonothermal system using corrosion resistant alloys would probably be more useful in a large scale industrial process.

A mixture of CaS and SrS powder in the starting charge resulted in the growth of a mixture of solid solutions of CaS and SrS. Powder patterns showed numerous peaks from solid solutions of different composition and even individual crystals had broad streaks instead of well defined spots on a rotation photograph. However, it is probable that single crystals of $Ca_xSr_{1-x}S$ of more uniform composition can be obtained using different conditions.

Using a $Ca_{0.75}Cd_{0.25}S$ or a mixture of CaS and CdS as a source material resulted in single crystals of CaS at the top or the cooler portion of the quartz tube reaction vessel, and small hexagonal single crystal plates of CdS at the bottom or the hot zone of the quartz tube reaction vessel. Thus this process can be used to grow crystals of group 12 (Group IIB) chalcogenides with an arrangement where growth occurs in the hot zone. Group 12 elements include zinc, cadmium and mercury. Cadmium is the preferred Group 12 element for purposes herein. For example, the temperature difference in the furnace could be reversed so that the top zone is hotter for a vertical reactor, or a horizontal reactor could be used with the temperature difference along its length, with one end being hotter than the opposing end.

Having described the invention, the following examples are given as particular embodiments thereof and to demonstrate the practice and advantages thereof. It is understood that the examples are given by way of illustration and are not intended to limit the specification or the claims in any manner.

EXAMPLE 1

This example demonstrates growth of binary CaS single crystals in a medium consisting of CaS powder and $NH_4I$ acid mineralizer in ammonia solvent in a fused quartz tube 5 mm OD, 3 mm ID and 16 cm long sealed at one end. The apparatus used in this experiment is illustrated in FIG. 1 where 10 is the reaction vessel or quartz tube with bottom 12 and top 14. Tube 10 is disposed vertically and generally centrally within pressure vessel 20 having wall thickness of 10 mm and ID of 8 mm. Between tube 10 and pressure vessel 20 is water. The apparatus used in this experiment is also known as LECO HR-1B-2 Hydrothermal System and is commercially available.

Pursuant to the process herein, the tube was charged in a Dri-Lab apparatus with 250 mg or 3.5 mmol CaS powder, 168 mg or 1.2 mmol dried $NH_4I$ and 18.5 mmol anhydrous $NH_3$ that was condensed into the tube on a $10^{-4}$ Torr vacuum line. Purity of CaS powder was 99.99% and its average particle size was −325 mesh. CaS has melting point of 2600° C. $NH_4I$ was sublimed to remove water and thus purify it. The tube was sealed at a height of about 14 cm giving an overall fill factor of about 68%. After loading the tube into the pressure vessel, as shown in FIG. 1., the vessel was pressurized to about 10,000 psi with distilled water and heated in a furnace to 400° C. for 1000 minutes. At this temperature and pressure, water and ammonia were supercritical fluids. Pressure inside the reaction vessel during heating thereof is believed to be on the order of 30,000 psi.

The reaction temperature was measured by a thermocouple at point 30, or the bottom portion of pressure vessel 20, as indicated in FIG. 1. This was assumed to be the temperature at bottom 12 of tube 10 which was about 50° C. lower than the temperature in the furnace 40 and 50° C. higher than the furnace at point 50.

The tube, having stable CaS single crystals formed at the top, was removed from the pressure vessel, dipped momentarily in liquid nitrogen to freeze and thus cool its contents, broken and the CaS single crystals were removed from the tube by scraping with a stiff wire. The crystals were washed with ethanol and acetone several times and dried. Whenever a crystal had fallen into the charge, water was used to wash the charge from the crystal.

The stable CaS single crystals did not lose the solvent and did not decompose when they were removed from the tube. Infrared spectra of CaS single crystals showed the presence of ammonium ion/ammonia with strong absorption bands at 3110, 2940 and 2805 $cm^{-1}$ (NH stretch) and 1420 $cm^{-1}$ (NH bend). Heating the CaS crystals under vacuum to 500° C. evolved only $CO_2$ and organic compounds, which were probably absorbed onto the surface. No ammonia was evolved from the crystals which indicates that ammonia filled inclusions were not present in large amounts. When a small amount of 18 mg of $NH_4I$ mineralizer was used, the the infrared absorptions for $NH_4^+$ ion were absent from the crystals.

EXAMPLE 2

This example demonstrates growth of ternary $CaCu_2S_2$ and $NH_4CU_4S_3$ single crystals in the manner described in Ex. 1 with the exception of also loading into the ampoule reaction vessel CuI in amount of 132 mg or 0.69 mmol. Purity of CuI powder was 99.9% and heating at a temperature of 360° C.

In addition to forming CaS single crystals at the top of the tube, black square plates of $NH_4Cu_4S_3$ single crystals also formed near the top of the tube. Yellow to orange hexagonal single crystal plates of $CaCu_2S_2$ ternary chalcogenide also formed near the middle to top of the tube and were intermixed with single crystals of $NH_4Cu_4S_3$, copper-doped CaS and black, wire-like single crystals of $NH_4Cu_7S_4$.

When the amounts of the reastants were 0.3 mmol $NH_4I$, 0.7 mmol CaS, 0.8 mmol CuI and 0.15 mmol S, with temperature at 370° C., crystals of $Cu_7S_4$ and CuS were isolated from the mixture.

While presently preferred embodiments have been shown of the novel process, persons skilled in this art will readily appreciate that various additional changes and modifications can be made without departing from the spirit of the invention as defined and differentiated by the following claims.

What I claim is:

1. A process comprising the steps of
   (a) charging, with or without seed crystals to nucleate growth, into a reaction vessel having a temperature difference between its ends of at least 1° C. a divalent metal chalcogenide or components thereof, with or without a transition element or a halide thereof, the divalent metal is selected from the group consisting of alkaline earths, Group 12 elements of the Periodic Table, europium, and mixtures thereof; sufficient amount of an acid mineralizer to form a single crystal material; and sufficient amount of ammonia to at least solubilize the chalcogenide, with or without a transition element of Groups 4–11 or a halide thereof; to a fill factor of 30–95%, based on the volume of the contents of the reaction vessel;
   (b) sealing the reaction vessel;
   (c) heating contents of the reaction vessel to at least 300° C. for a duration sufficient to form single crystal divalent metal chalcogenide, with or without a transition element;
   (d) cooling contents of the reaction vessel;
   (e) removing from the reaction vessel the single crystals of the divalent metal chalcogenide, with or without a transition element, or a transition metal chalcogenide.

2. The process of claim 1 wherein the fill factor is 55–85%, the heating temperature is 350–550° C., the heating duration is 1–50 hours and ammonia is anhydrous ammonia.

3. The process of claim 2 wherein amount of the acid mineralizer is from a trace amount to 0.5 mole per mole of the divalent metal chalcogenide.

4. The process of claim 2 wherein the heating duration is 2–24 hours, amount of the acid mineralizer is 0.01–0.5 mole per mole of the divalent metal chalcogenide and the temperature difference in the reaction vessel is at least 20° C.

5. The process of claim 4 wherein the divalent metal is selected from the group consisting of calcium, magnesium, strontium, barium, and mixtures thereof; wherein the chalcogen element of the alkaline earth chalcogenide is selected from the group consisting of sulfur, selenium, tellurium, and mixtures thereof; and wherein the acid mineralizer is selected from the group consisting of ammonia-soluble ammonium halides, other ammonia soluble ammonium salts, alkyl ammonium and alkyl phosphonium salts, and mixtures thereof.

6. The process of claim 5 wherein binary single crystal material forms at the top of the reaction vessel and ternary single crystal material forms at the top, bottom or between top and bottom of the reaction vessel.

7. The process of claim 6 wherein the reaction vessel is made of quartz, wherein the sealing step is accomplished by flame sealing the quartz reaction vessel, the process including the additional steps of positioning the reaction vessel in a pressure vessel in a spaced relationship thereto so that there is space between the reaction vessel and the pressure vessel with a fluid disposed in the space, pressuring the fluid to provide counter pressure on the reaction vessel, and placing the pressure vessel with the reaction vessel therein into a furnace where contents of the reaction vessel are heated and the single crystal material is formed in the reaction vessel.

8. The process of claim 7 wherein the fluid is water and where the cooling is effected by removing heat from the furnace and allowing contents of the reaction vessel to cool over a period of 1–10 hours.

9. The process of claim 4 wherein the divalent metal is selected from the group consisting of calcium, strontium, barium, cadmium, zinc and mixtures thereof; wherein the chalcogen element of the chalcogenide is sulfur; and wherein the acid mineralizer is selected from the group consisting of ammonia-soluble ammonium halides.

10. The process of claim 4 wherein the divalent metal is selected from the group consisting of calcium, strontium, cadmium and mixtures thereof; wherein the chalcogen element of the chalcogenide is sulfur; and wherein the acid mineralizer is selected from the group consisting of ammonium iodide, ammonium bromide, ammonium chloride, and mixtures thereof.

11. The process of claim 2 wherein amount of the acid mineralizer is 0.05–0.3 mole per mole of the chalcogenide.

12. A process comprising the steps of
  (a) charging to an elongated quartz reaction vessel having a temperature difference between its ends of at least 1° C. ammonia solvent, an alkaline earth sulfide powder, with or without copper iodide, and ammonium iodide acid mineralizer in amount of 0.01–0.5 mole per mole of the alkaline earth sulfide, the reaction vessel being 30–95% full, based on the volume of the contents in the reaction vessel;
  (b) sealing the reaction vessel from the atmosphere;
  (c) placing the sealed reaction vessel within a pressure vessel in a spaced relationship thereto forming a space therebetween with a fluid disposed in the space;
  (d) pressurizing the fluid to impart counter pressure on the reaction vessel;
  (e) heating contents of the reaction vessel at 300–550° C. for 1–50 hours by placing the loaded pressure vessel into a furnace whereby contents of the reaction vessel are subjected to high pressure and temperature of 300–550° C. and form single crystal materials of alkaline earth sulfides, with or without copper;
  (f) cooling contents of the reaction vessel; and
  (g) removing single crystal materials from the reaction vessel.

13. The process of claim 12 wherein the fill factor is 55–85%, wherein the heating duration is 2–24 hours, and wherein amount of the acid mineralizer is 0.05–0.3.

14. The process of claim 13 wherein the heating temperature is 350–500° C.

15. The process of claim 14 wherein the alkaline earth element of the alkaline earth sulfide is selected from the group consisting of calcium, strontium, barium, and mixtures thereof; and the temperature difference in the reaction vessel is at least 20° C.

16. The process of claim 15 including a dopant in the reaction vessel in an amount on the order of ppm to 5%, based on the weight of the alkaline earth sulfide, with or without copper iodide.

17. The process of claim 16 wherein the dopant is selected from the group consisting of manganese iodide, copper iodide, and mixtures thereof.

18. The process of claim 14 including a copper iodide reactant in the reaction vessel in an amount of 20–115%, based on the weight of the alkaline earth chalcogenide added to the reaction vessel.

19. The process of claim 14 wherein the fluid between the pressure vessel and the reaction vessel is water; and wherein during the heating of the pressure and the reaction vessels, water between the pressure and the reaction vessels and ammonia in the reaction vessel are supercritical fluids.

* * * * *